(12) United States Patent
Terrani et al.

(10) Patent No.: US 11,285,635 B2
(45) Date of Patent: Mar. 29, 2022

(54) ADDITIVE MANUFACTURING OF COMPLEX OBJECTS USING REFRACTORY MATRIX MATERIALS

(71) Applicant: UT-Battelle, LLC, Oak Ridge, TN (US)

(72) Inventors: Kurt A. Terrani, Knoxville, TN (US); Michael P. Trammell, Knoxville, TN (US); Brian C. Jolly, Knoxville, TN (US)

(73) Assignee: UT-BATTELLE, LLC, Oak Ridge, TN (US)

( * ) Notice: Subject to any disclaimer, the term of this patent is extended or adjusted under 35 U.S.C. 154(b) by 131 days.

(21) Appl. No.: 16/527,317

(22) Filed: Jul. 31, 2019

(65) Prior Publication Data

US 2020/0156282 A1    May 21, 2020

Related U.S. Application Data

(60) Provisional application No. 62/769,588, filed on Nov. 20, 2018.

(51) Int. Cl.
*B28B 1/00* (2006.01)
*B22F 7/02* (2006.01)
(Continued)

(52) U.S. Cl.
CPC ............ *B28B 1/001* (2013.01); *B22F 3/1007* (2013.01); *B22F 3/1021* (2013.01); *B22F 7/02* (2013.01);
(Continued)

(58) Field of Classification Search
CPC .................................. B28B 1/001; B22F 7/02
(Continued)

(56) References Cited

U.S. PATENT DOCUMENTS

| | | |
|---|---|---|
| 5,204,055 A | 4/1993 | Sachs et al. |
| 5,387,380 A | 2/1995 | Cima et al. |
| 2016/0251269 A1* | 9/2016 | Luthra ................... C04B 35/515 428/212 |

FOREIGN PATENT DOCUMENTS

| | | |
|---|---|---|
| CN | 108706978 A | 10/2018 |
| EP | 0885859 A2 | 12/1998 |
| WO | 2018136631 A2 | 7/2018 |

OTHER PUBLICATIONS

Partial search report dated for Nov. 9, 2019 in corresponding International patent application No. PCT/US2019/044276 filed on Jul. 31, 2019.

(Continued)

*Primary Examiner* — Weiping Zhu
(74) *Attorney, Agent, or Firm* — Warner Norcross + Judd LLP

(57) ABSTRACT

A method for the manufacture of a three-dimensional object using a refractory matrix material is provided. The method includes the additive manufacture of a green body from a powder-based refractory matrix material followed by densification via chemical vapor infiltration (CVI). The refractory matrix material can be a refractory ceramic (e.g., silicon carbide, zirconium carbide, or graphite) or a refractory metal (e.g., molybdenum or tungsten). In one embodiment, the matrix material is deposited according to a binder-jet printing process to produce a green body having a complex geometry. The CVI process increases its density, provides a hermetic seal, and yields an object with mechanical integrity. The residual binder content dissociates and is removed from the green body prior to the start of the CVI process as temperatures increase in the CVI reactor. The CVI process selective deposits a fully dense coating on all internal and external surfaces of the finished object.

5 Claims, 8 Drawing Sheets

(51) Int. Cl.
*B22F 3/10* (2006.01)
*C04B 35/573* (2006.01)
*G21C 3/324* (2006.01)
*C04B 35/52* (2006.01)
*C04B 35/56* (2006.01)

(52) U.S. Cl.
CPC .......... *C04B 35/52* (2013.01); *C04B 35/5622* (2013.01); *C04B 35/573* (2013.01); *G21C 3/324* (2013.01); *B22F 2301/20* (2013.01); *B22F 2302/105* (2013.01); *B22F 2998/10* (2013.01); *C04B 2235/614* (2013.01); *C04B 2235/77* (2013.01)

(58) Field of Classification Search
USPC .......................................................... 419/7
See application file for complete search history.

(56) References Cited

OTHER PUBLICATIONS

International Search Report and Written Opinion in corresponding International patent application No. PCT/US2019/044276 dated Jan. 10, 2020.

\* cited by examiner

ADDITIVE MANUFACTURING OF COMPLEX OBJECTS USING REFRACTORY MATRIX MATERIALS

CROSS-REFERENCE TO RELATED APPLICATIONS

This application claims the benefit of U.S. Provisional Application 62/769,588, filed Nov. 20, 2018, the disclosure of which is incorporated by reference in its entirety.

STATEMENT REGARDING FEDERALLY SPONSORED RESEARCH AND DEVELOPMENT

This invention was made with government support under Contract No. DE-AC05-00OR22725 awarded by the U.S. Department of Energy. The government has certain rights in the invention.

FIELD OF THE INVENTION

The present invention relates to the additive manufacture of complex objects using refractory materials for a variety of energy-related applications.

BACKGROUND OF THE INVENTION

The majority of worldwide energy systems today are designed to convert heat to electricity. The heat may be generated from fossil fuels, solar thermal methods, or nuclear fission or fusion, for example. The second law of thermodynamics dictates that in order to extract the maximum efficiency from heat engines, high operating temperatures are necessary. A majority of the pathways that allow for conversion of heat to electricity, such as Rankine or Brayton cycles, require a thermal fluid. The ability to achieve high efficiencies requires high fluid temperatures. This in turn requires components that are made from materials that can withstand these high temperatures. These materials may form the combustion vessel or reactor core in a fossil or fission energy system, respectively, as well as piping, heat exchangers, and power conversion components. Refractory materials that can withstand high temperatures are therefore ideal in these applications.

While the production of simple geometries (e.g., piping) from refractory metals or ceramics is possible today, components of higher complexity, for example heat exchangers, flanges, and turbines, are not readily produced. The ability to use refractory metals and ceramics for the manufacture of complex components would greatly improve the thermal efficiency of these energy systems, well beyond what is possible with conventional means, for example high temperature Ni-based superalloys. Accordingly, there remains a continued need for methods for the manufacture of components from refractory materials, including for example ceramics and metals, the components having complex three-dimensional geometries for use in energy systems and other applications.

SUMMARY OF THE INVENTION

A method for the manufacture of three-dimensional objects using a refractory matrix material is provided. The method generally includes the additive manufacture of a green body from a powder-based refractory matrix material and densification of the green body via chemical gas deposition, for example chemical vapor infiltration (CVI). The refractory matrix material can include a refractory ceramic or a refractory metal, depending on the particular application. The CVI treatment increases the density of the matrix material, provides a hermetic coating, and can form an object with excellent mechanical integrity at extremely high temperatures.

In one embodiment, the method includes providing a powder feedstock of a suitable refractory matrix material, for example silicon carbide (SiC), zirconium carbide (ZrC), graphite (C), molybdenum (Mo), or tungsten (W). The method includes selectively depositing a binder onto successive layers of the powder feedstock to produce a dimensionally stable green body have the near net-shape of the object being formed, the green body optionally including an undercut, overhang, or internal volume. The green body is heated within a CVI reactor vessel for debinding, and a precursor gas is introduced for densifying the matrix material. The resulting object includes a substantially pure microstructure with excellent resistance to high temperatures. Example objects include heat exchangers, turbines, flanges, to name only a few.

In another embodiment, a method for manufacturing an integral nuclear fuel element is provided. The method includes binder-jet printing a fuel envelope using a non-fuel matrix powder. The method further includes filling the envelope with nuclear fuel particles and vibro-packing additional matrix powder to yield a fuel compact therein. The method further includes performing CVI on the now-filled envelope to seal the nuclear fuel therein. The resulting nuclear fuel element can include cooling channels integrally formed therein to allow the flow of a cooling fluid, for example helium (He) gas, and can be formed of a material having favorable neutron transparency, for example SiC. The nuclear fuel particles can include an improved packing fraction over existing methods, and the nuclear fuel element can be manufactured at temperatures far below what is necessary for sintering existing fuel matrix materials.

In another embodiment, the integral nuclear fuel element can include a hexagonal constructional that is stackable as a prismatic block, with a matrix holding the fuel constituents and offering an integral cladding structure. When stacked, the cooling channels of each nuclear fuel element are in fluid communication with the cooling channels of a vertically adjacent nuclear fuel element. The densified and highly pure refractory envelope can withstand normal operating temperatures within a reactor core while under neutron irradiation, for example temperatures of between 800° C. and 1200° C. in a high temperature gas-cooled reactor (HTFR) reactor. Further, the shape and surface features of the cooling channels can be manufactured with optimized geometries to improve cooling of the nuclear fuel therein, as the thermal energy is optimally transmitted to the cooling gas. Further embodiments include burnable absorbers and/or neutron moderators within the nuclear fuel element.

As set forth herein, the present method is readily adapted for fabricating objects having complex geometries in applications where high heat resistance is desired. Additive manufacturing of the green body is generally performed at room temperature, and the CVI furnace operates at temperatures far below sintering temperatures. In embodiments having nuclear fuel contained therein, the packing fraction of nuclear fuel particles was found to be greater than 50%, outpacing the packing density found in pressed and sintered nuclear fuels, resulting in smaller nuclear fuel assemblies.

These and other features of the invention will be more fully understood and appreciated by reference to the description of the embodiments and the drawings.

Before the embodiments of the invention are explained in detail, it is to be understood that the invention is not limited to the details of operation or to the details of construction and the arrangement of the components set forth in the following description or illustrated in the drawings. The invention may be implemented in various other embodiments and of being practiced or being carried out in alternative ways not expressly disclosed herein. In addition, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof. Further, enumeration may be used in the description of various embodiments. Unless otherwise expressly stated, the use of enumeration should not be construed as limiting the invention to any specific order or number of components. Nor should the use of enumeration be construed as excluding from the scope of the invention any additional steps or components that might be combined with or into the enumerated steps or components.

DETAILED DESCRIPTION OF THE CURRENT EMBODIMENTS

As discussed herein, the current embodiments generally relate to a method for the manufacture of a wide-variety of object using a refractory matrix material. The method includes the additive manufacture of a green body from a powder-based refractory matrix material followed by densification via CVI. The method of manufacture is generally discussed in Part I below, followed by a description of an integral nuclear fuel element formed according to this method in Part II below. Though described in connection with a nuclear fuel element, the present method is applicable in effectively any application in which a complex three-dimensional object requires high heat resistance, including heat exchangers, flanges, and turbines blades for example. Similarly, just as nuclear fuel may be embedded inside the refractory matrix, other constitutes and devices may be incorporated into the matrix.

I. Method of Manufacture

Figure 1:
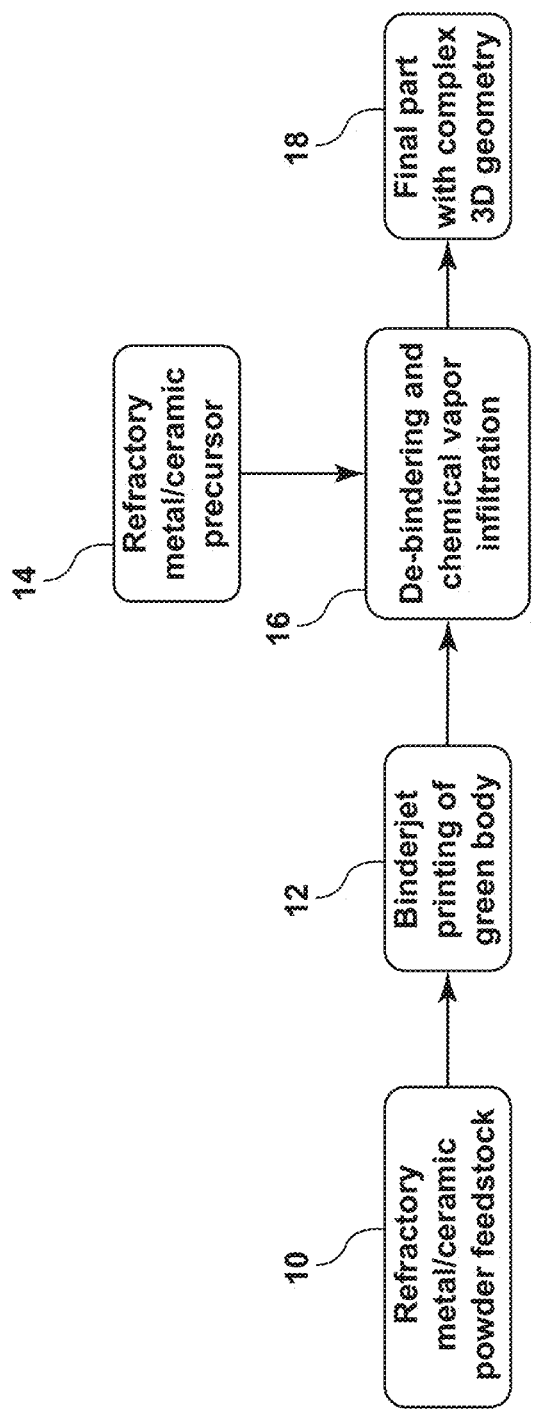
FIG. 1 is a flow chart for manufacturing an object using a refractory material according to one embodiment of the invention.

A method according to one embodiment includes the manufacture of a three-dimensional object using a refractory matrix material. With reference to FIG. 1, the method generally includes (a) the selection of a refractory feedstock, (b) the additive manufacture of a green body using the refractory feedstock, (c) the introduction of a refractory gaseous precursor for CVI, (d) CVI of the green body for densification and removal of the binder, and (e) the completion of the final part having a complex three-dimensional geometry. Each such operation is separately discussed below.

The selection of a refractory feedstock at step 10 includes the selection of a refractory ceramic powder feedstock or a refractory metal powder feedstock. A suitable refractory ceramic can include, for example, SiC, C, or ZrC, and a suitable refractory metal can include, for example, Mo or W. At step 12, the green body is formed according to an additive manufacturing process to produce a three-dimensional object. In the current embodiment, the green body is formed according to a binder-jet printing process. In the binder-jet printing process, a powder bed of the refractory material is printed at ambient temperatures with a binder pattern layer-by-layer, as optionally set forth in U.S. Pat. No. 5,204,055 to Sachs et al and U.S. Pat. No. 5,387,380 to Cima et al, the disclosures of which are incorporated by reference in their entirety. More particularly, the powder feedstock is deposited in sequential layers, one on top of the other. Following the deposit of each layer of powder feedstock, a liquid binder material, for example a polymeric binder, is selectively supplied to the layer of powder feedstock in accordance with a computer model (e.g., CAD model) of the three-dimensional object being formed.

Once the three-dimensional object is completed, the unbound powder is removed, yielding a near net-shaped green body held together by the removable polymeric binder. The green body can have a binder content on the order of a few wt %, for example 1-5%, with a density of about 30-55% of their theoretical limit. For example, the green body is a dimensionally stable object of greater than 30% by weight of SiC (or other refractory material) in one embodiment, further optionally greater than 50% by weight SiC (or other refractory material) in other embodiments. At step 14, a gaseous refractory precursor for CVI is selected, such that the finished object can include a highly pure and uniform matrix. For example, the gaseous refractory precursor for CVI of a SiC green body can include Methyl-TrichloroSilane (MTS) that gives SiC by the MTS decomposing. Further by example, the gaseous refractory precursor for a ZrC green body can include zirconium tetrachloride ($ZrCl_4$) gas, the gaseous refractory precursor for a graphite (C) green body can include methane ($CH_4$) gas, the gaseous refractory precursor for CVI of a W green body can include tungsten hexafluoride ($WF_6$) gas, and the gaseous refractory precursor for CVI of a Mo green body can include molybdenum hexafluoride ($MoF_6$) or molybdenum pentachloride ($MoCl_5$) gas. In other embodiments, however, a composite matrix may be realized by printing one material in powder form and depositing another material around the powder with CVI.

Figure 2:
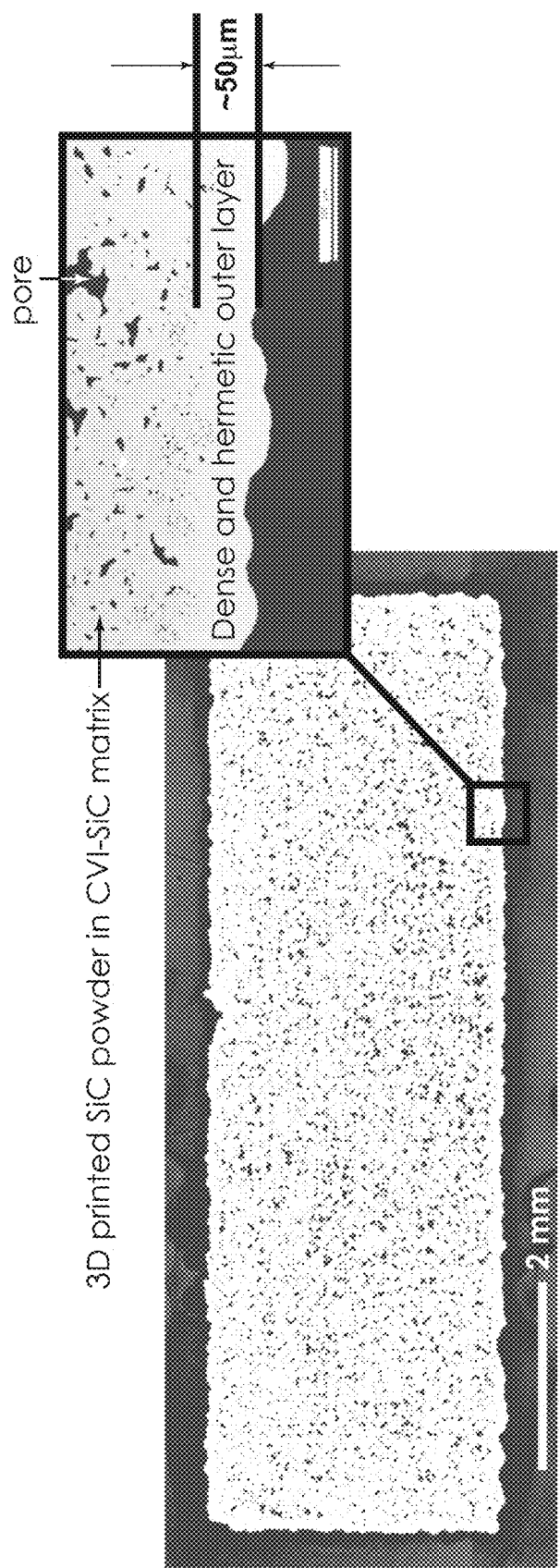
FIG. 2 is a cross section of a SiC specimen after CVI possessing a dense and hermetic outer layer.

At step 16, the green body is placed in a CVI furnace (reactor vessel) into which the gaseous precursor and carrier gas that could be inert (e.g. Ar) or otherwise (e.g. $H_2$) is admitted. The pressure and temperature within the furnace and the composition, partial pressure and flow rate of the gaseous precursor are selected to allow the gaseous precursor to diffuse within the pores of the green body. More specifically, CVI involves the temperature decomposition of the gaseous precursor (e.g., MTS or $WF_6$) and the infiltration and then absorption of the decomposed precursor within the pores of the matrix material (e.g., SiC or W). The CVI process for SiC involves a process temperature of between 850° C. and 1300° C., 1000° C. and 1200° C., optionally 1100° C., which is far below the temperatures required for sintering in existing methods (~2000° C.). Of note, as the temperatures increase within the CVI furnace, the binder dissociates and is removed prior to the start of the CVI process. The CVI process initially uniformly densifies the green body, and as the pores inside the green body become closed, the CVI selectively deposits a fully dense coating on all internal and external surfaces of the three-dimensional object. The densified green body can include a density of greater than 85% by weight of SiC in some embodiments, and greater than 90% by weight of SiC in other embodiments. This phenomenon is further illustrated in FIG. 2, which includes a cross-section of a binder-jet printed SiC specimen having a complex geometry. The cross-section includes a dense and hermetic outer layer with a thickness on the order of 20 to 200 μm, further optionally 50 to 100 μm. As also shown in the inset of FIG. 2, a continuous CVI SiC matrix is deposited around the SiC powders, such that the microstructure includes both the original 3D printed SiC powder and a continuous CVI SiC matrix.

Figure 3B:
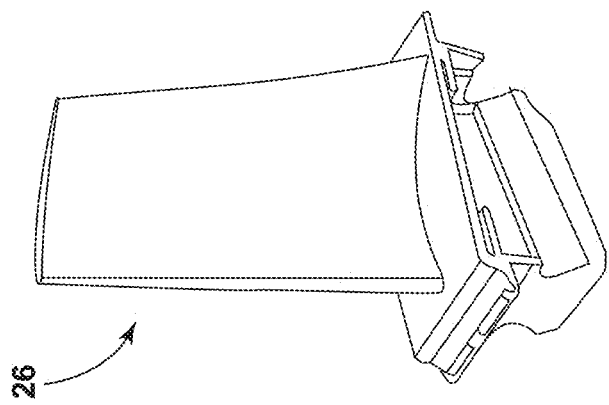
FIGS. 3A and 3B are example objects (heat exchanger and turbine blade) manufactured in accordance with one embodiment of the present invention.
Figure 3A:
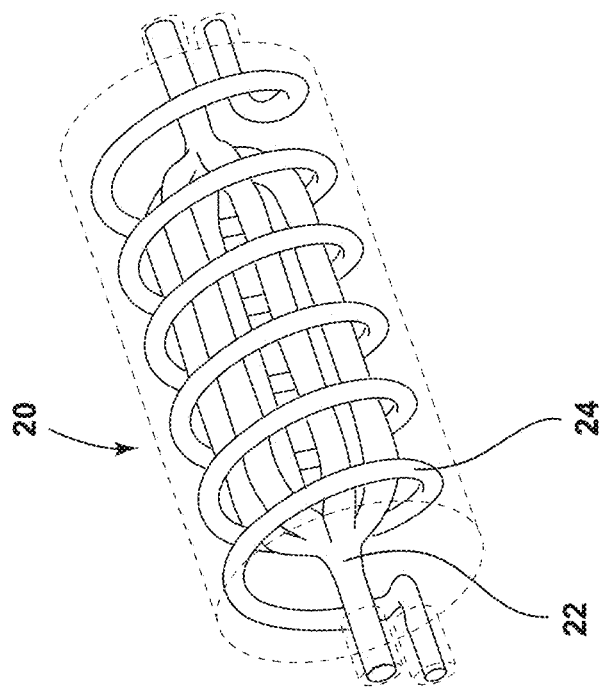

Completion of the final part is depicted at step 18. Owing to the formation of the green body by additive manufacturing, the finished article can possess almost any geometry, including overhangs, undercuts, and internal volumes. As shown in FIG. 3A for example, green body can include a heat exchanger 20 having a multi-channel primary loop 22 and a helical secondary loop 24 (or vice versa), each defining a complex internal volume not readily formed according to conventional methods. As alternatively shown in FIG. 3B for example, the present method can be used to form a turbine blade 26 or other objects whose manufacture is difficult or not possible according to conventional methods.

II. Integral Nuclear Fuel Element

An integral nuclear fuel element and its method of manufacture will now be described. As set forth below, the integral nuclear fuel element generally includes a CVI-densified fuel envelope formed of a 3D printed refractory matrix material and containing uniformly dispersed fuel particles therein, for example TRISO nuclear fuel particles, the fuel envelope optionally being shaped as a prismatic fuel block.

Figure 4:
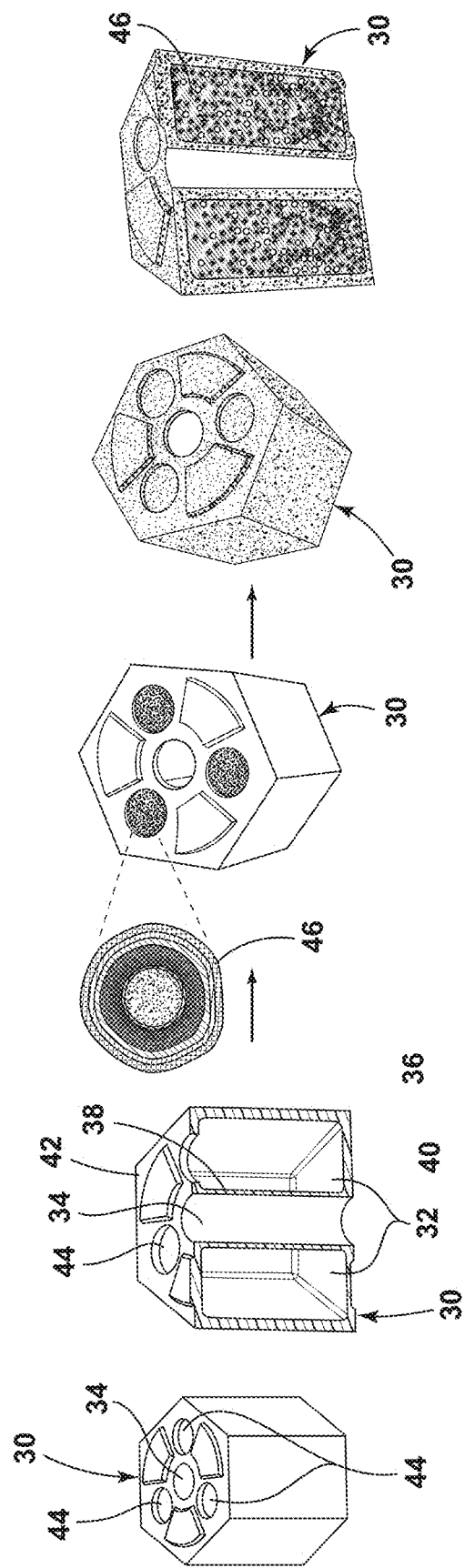
FIG. 4 is a process diagram illustrating the additive manufacturing of an integral nuclear fuel element.
Figure 5:
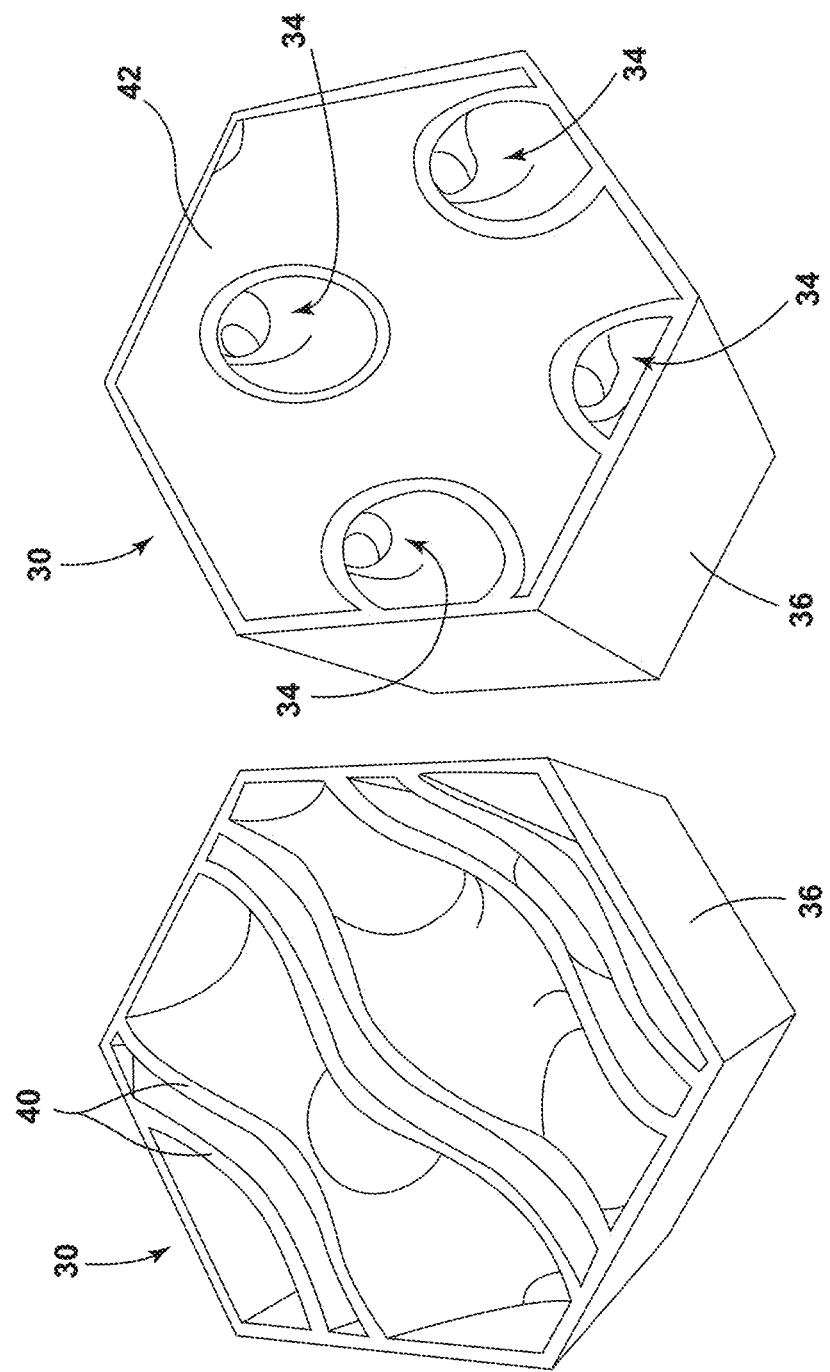
FIG. 5 includes top perspective views of integral nuclear fuel element in accordance with additional embodiments.
Figure 6:
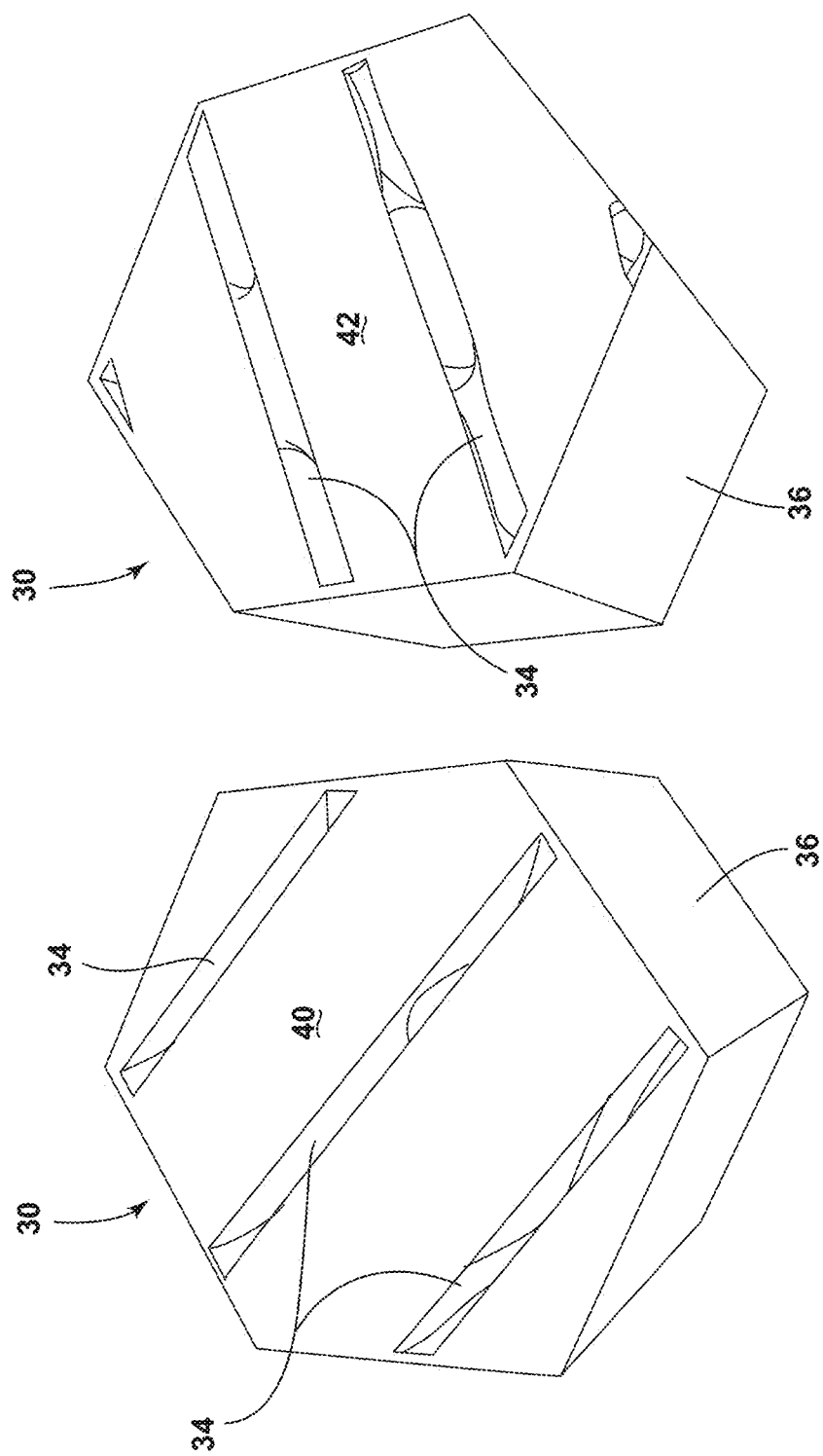
FIG. 6 includes bottom perspective views of the integral nuclear fuel element of FIG. 5.
Figure 7:
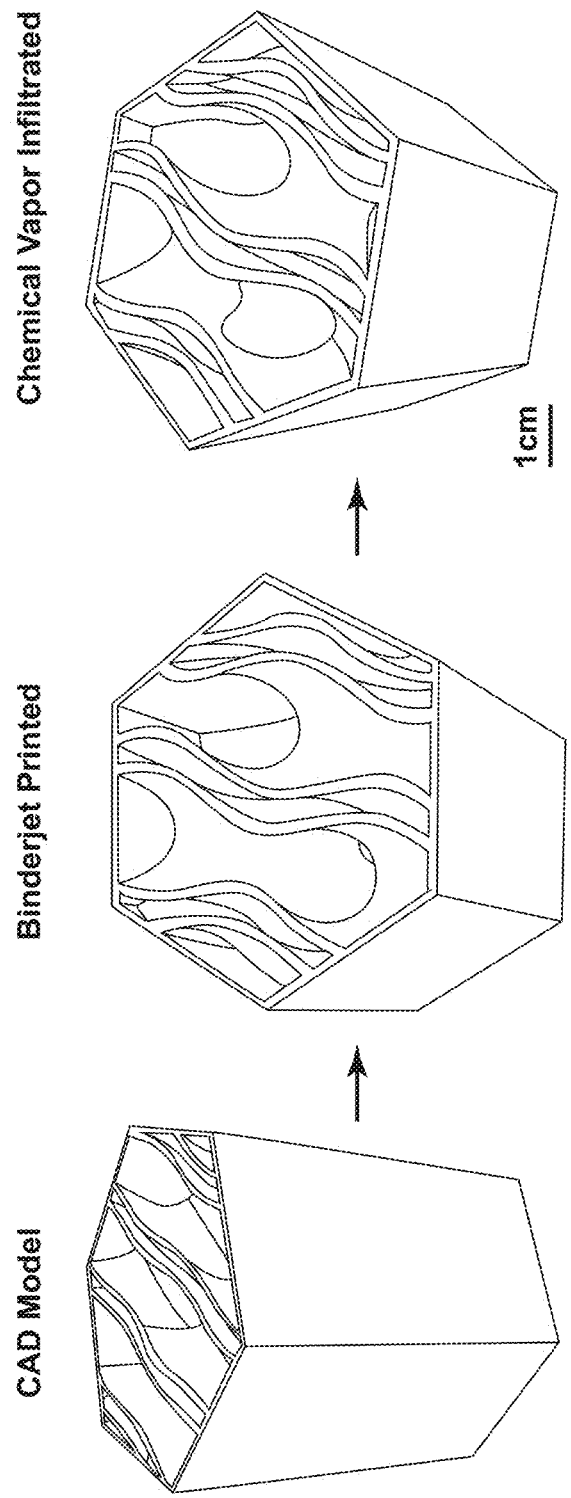
FIG. 7 is an illustration of a nuclear fuel envelope at different stages of the manufacturing process.

As shown in FIGS. 4-7, an integral nuclear fuel element is formed by binder-jet printing a rigid envelope 30 from a refractory powder feedstock. The envelope 30 can include any construction having at least one internal volume (or cavity) 32 for a nuclear fuel and optionally at least one cooling channel 34. In the illustrated embodiments, the internal volume 34 is defined between an outer sidewall 36, an inner sidewall 38, a base 40, and a cap 42, the internal volume 32 being accessible through one or more openings 44 in the cap 42. The envelope 30 includes a hexagonal construction in the present embodiment, but can include other constructions in other embodiments, including for example cylindrical or any other construction including those that are axial and radially asymmetric. In the embodiment shown in FIG. 4, a single cooling channel 34 extends vertically through the center of the envelope 30, interconnecting the base 40 with the cap 42, such that the internal volume 32 concentrically surrounds the cooling channel 34. In the embodiments of FIGS. 5 and 6, multiple cooling channels 34 extend vertically through the envelope 30, but differ from the cooling channel of FIG. 4 in that the cooling channels of FIGS. 5 and 6 are non-linear or curvilinear, diverging and/or converging, and optionally port the cooling gas from the envelope at a non-zero angle relative to vertical. Because the binder-jet printing process can accommodate overhangs, undercuts, and internal volumes, the internal volume and the cooling channel can achieve effectively any geometry, with the geometries of FIGS. 4-6 being depicted for illustrative purposes. FIG. 7 shows the general manufacturing steps for the nuclear fuel envelope of FIGS. 5 and 6 with the leftmost illustration showing the CAD model for the fuel envelope, the center illustration showing the 3D printed envelope and the rightmost illustration showing the CVI-densified fuel envelope (without the fuel particles for the sake of disclosure).

Figure 8:
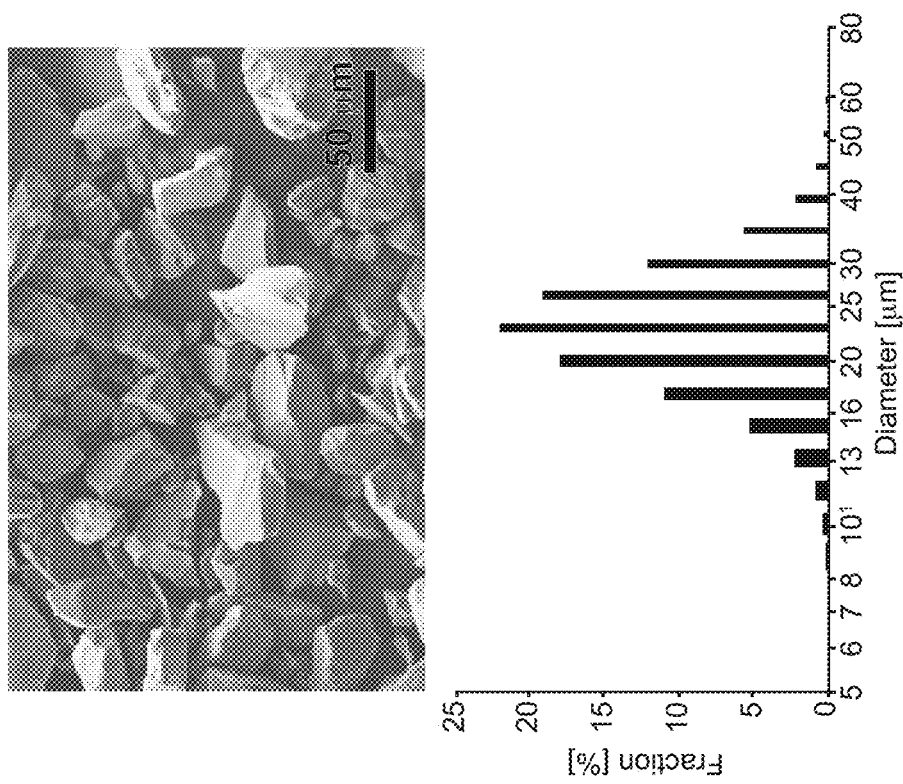
FIG. 8 is an electron micrograph and particle size distribution of a refractory material.

The envelope is generally formed of a non-fuel refractory powder feedstock. Examples include SiC, C, ZrC, Mo, and W. FIG. 8 shows an SiC powder morphology and size distribution suitable for use in manufacturing the fuel envelope. Refractory powders in a range of alternative morphologies and alternative size distributions may be used in alternative applications. In this embodiment, the SiC powder is α-SiC (hexagonal phase) feedstock from Sigma Aldrich with a purity >99.5%. The powder feedstock is deposited in successive layers according to a binder-jet printing process, with a liquid binder being selectively supplied to each layer of powder feedstock in accordance with the CAD model of the envelope. In the illustrated embodiment, the envelope is 3D printed using an Innovent binderjet system from ExOne Company (North Huntingdon, Pa.). The envelope may, however, be formed using a wide variety of alternative binder-jet printers. After printing, the powder bed may undergo a binder curing step that drives off the majority of the aqueous or organic-based solvent. For example, the powder bed may be heated at about 190° C. for approximately 6 hours in air.

Once the envelope is fully printed, the unbound powder is removed, yielding for example the near net-shaped green body shown at left in FIG. 4. Subsequent to the formation of the green body, and prior to CVI, fuel particles 46 are added to the internal fuel cavity. The fuel particles can include uranium or other fissile elements, and can be bare fuel kernels or coated particles, for example tri-structural isotropic (TRISO) particles, bi-structural isotropic (BISO) particles, and bare uranium-bearing (e.g., $UO_2$, UC, UN, or there combinations) spheres (fuel kernels) containing fissile uranium. Further optionally, the fuel particles can include a combination of bare fuel kernels and coated particles. The fuel particles are added to the internal cavity according to any desired technique, for example from a hopper, until substantially full. Additional matrix powder feedstock is then added to the internal cavity, being at least an order of magnitude smaller than the fuel particles, to occupy the voids between adjacent fuel particles, while also coating the exposed fuel particles at the openings 44. Further optionally, the additional matrix powder feedstock can be vibro-packed to ensure maximum densification prior to chemical vapor infiltration.

Figure 9:
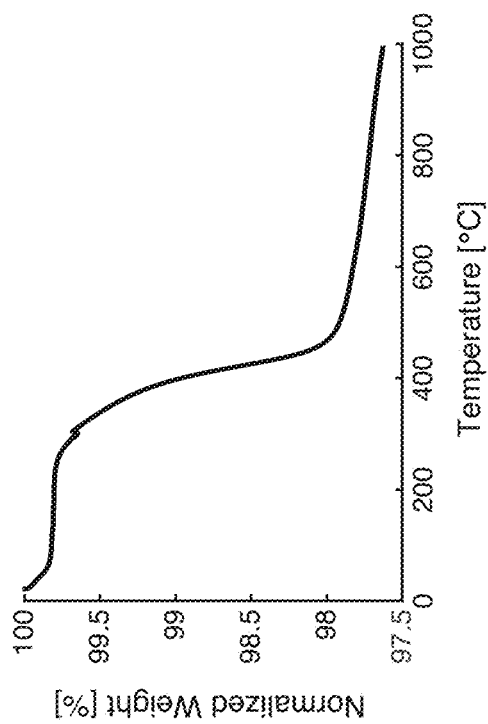
FIG. 9 is a graph showing a representative weight evolution of a green part during heating.

Subsequent to filling and vibro-packing the envelope with fuel particles and optional additional matrix material, the envelope is inserted within a CVI furnace and elevated to a temperature that is ideal for the specific CVI process. For instances, a temperature of between 850° C. and 1300° C., 1000° C. and 1200° C., optionally 1100° C., is ideal for SiC deposition with MTS, while temperatures <750° C. are ideal for W deposition using $WF_6$. As the temperature is elevated in the CVI furnace, the polymeric binder dissociates starting at ~200° C. with dissociation complete at 500° C. During dissociation, the continuous inert gas flow in the CVI furnace vessel purges binder dissociation products. Once at the target CVI temperature, a gaseous precursor is introduced within the CVI furnace to allow additional matrix material deposition within the pores of the envelope. As the pores inside the envelope become closed, the CVI process selectively deposits a fully dense coating on all internal and external surfaces of the envelope. The resulting microstructure of the envelope includes high purity and an optionally uniform matrix, while sealing the nuclear fuel particles therein. As shown at right in FIG. 4, a cross-section of the resulting integral nuclear fuel element include a dense fuel compact with uranium fuel particles embedded in a hermetically sealed refractory envelope. The content of the matrix material in the densified envelope is greater than 85% in some embodiments, further optionally 90% in other embodiments, and still further optionally greater than 95% in other embodiments. Further, the matrix material (e.g., SiC) can comprise less than the 25% by volume of the integral nuclear fuel element 30. FIG. 9 shows the weight evolution in a green part produced with an aqueous binder after the optional curing step and upon heating in Ar to high temperature.

The integral nuclear fuel element includes a generally stackable construction. When arranged and stacked, the cooling channel(s) of each nuclear fuel element are in fluid communication with the cooling channel(s) of a vertically adjacent nuclear fuel element. The densified and highly pure refractory envelope can withstand normal operating temperatures within a reactor core, for example the reactor core of a high temperature gas-cooled reactor (HTGR) having a Brayton closed-cycle gas turbine or other power conversion means. In addition, the nuclear fuel within the nuclear fuel element includes an increased packing fraction over conventional fuels. For example, existing methods (pressing and sintering) provide packing fractions of up to 45%. By contrast, the packing fraction of the nuclear fuel particles within the fuel envelope of the present invention can be greater than 50%. As a result, nuclear fuel assemblies including the integral nuclear fuel elements of present invention can be made more compact. Further, the cooling channels can be manufactured with optimized geometries and surface features to improve cooling of the nuclear fuel compact therein, as the thermal energy is optimally transmitted to the cooling gas.

The above description is that of current embodiments of the invention. Various alterations and changes can be made without departing from the spirit and broader aspects of the invention as defined in the appended claims, which are to be interpreted in accordance with the principles of patent law including the doctrine of equivalents. This disclosure is presented for illustrative purposes and should not be interpreted as an exhaustive description of all embodiments of the invention or to limit the scope of the claims to the specific elements illustrated or described in connection with these embodiments. For example, and without limitation, any individual element(s) of the described invention may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative. Further, the disclosed embodiments include a plurality of features that are described in concert and that might cooperatively provide a collection of benefits. The present invention is not limited to only those embodiments that include all of these features or that provide all of the stated benefits, except to the extent otherwise expressly set forth in the issued claims. Any reference to claim elements in the singular, for example, using the articles "a," "an," "the" or "said," is not to be construed as limiting the element to the singular.

The invention claimed is:

1. A method for manufacturing an integral nuclear fuel element, the method comprising:
   providing a first powder feedstock of silicon carbide;
   binder-jet printing a fuel envelope by selectively depositing a binder onto successive layers of the first powder feedstock, the fuel envelope being rigid and of greater than 30% by weight of silicon carbide, wherein the fuel envelope has an outer sidewall, one or more inner sidewalls, a base and a cap that define therebetween an internal fuel cavity, the internal fuel cavity being accessible through one or more openings in the cap, and wherein the one or more inner sidewalls surround a cooling channel that interconnects the base with the cap;
   filling the internal fuel cavity by introducing nuclear fuel particles through the one or more openings and subsequently introducing a second powder feedstock of silicon carbide through the one or more openings, the second powder feedstock of silicon carbide being interposed between the nuclear fuel particles within the internal fuel cavity;
   positioning the fuel envelope having its internal fuel cavity filled with the nuclear fuel particles and the second feedstock of silicon carbide within a chemical vapor infiltration (CVI) reactor and introducing within the CVI reactor a precursor gas including silicon and a hydrocarbon while at an elevated temperature to densify the fuel envelope to a content of silicon carbide of greater than 85% by weight and to hermetically seal the nuclear fuel particles within the internal fuel cavity of the densified fuel envelope to obtain the integral nuclear fuel element with a content of silicon carbide of less than 25% by volume.

2. The method of claim 1 wherein the precursor gas includes methyltrichlorosilane (MTS).

3. The method of claim 1 wherein depositing a binder onto successive layers of the first powder feedstock is performed at ambient temperature.

4. The method of claim 1 wherein elevating the temperature within the CVI reactor includes heating the CVI reactor to between 850° C. and 1300° C.

5. The method of claim 1 further including introducing, through the one or more openings, a burnable absorber or a neutron moderator along with the nuclear fuel particles and the second powder feedstock of silicon carbide.

* * * * *